(12) United States Patent
Zhang et al.

(10) Patent No.: US 10,080,307 B2
(45) Date of Patent: Sep. 18, 2018

(54) SERVER RACK

(71) Applicant: HONGFUJIN PRECISION ELECTRONICS (TIANJIN) CO., LTD., Tianjin (CN)

(72) Inventors: Guang-Yi Zhang, Shenzhen (CN); Jia-Qi Fu, Shenzhen (CN); Hai-Chen Zhou, Shenzhen (CN)

(73) Assignee: HONGFUJIN PRECISION ELECTRONICS (TIANJIN) C, Tianjin (CN)

( * ) Notice: Subject to any disclaimer, the term of this patent is extended or adjusted under 35 U.S.C. 154(b) by 0 days.

(21) Appl. No.: 15/485,419

(22) Filed: Apr. 12, 2017

(65) Prior Publication Data

US 2018/0184539 A1    Jun. 28, 2018

(30) Foreign Application Priority Data

Dec. 23, 2016  (CN) .......................... 2016 1 1208195

(51) Int. Cl.
*H02B 1/20* (2006.01)
*H02B 1/01* (2006.01)
*H05K 7/14* (2006.01)

(52) U.S. Cl.
CPC ......... *H05K 7/1491* (2013.01); *H05K 7/1487* (2013.01); *H05K 7/1492* (2013.01)

(58) Field of Classification Search
CPC ... H05K 7/1491; H05K 7/1492; H05K 7/1487
USPC .................................................. 361/825–826
See application file for complete search history.

(56) References Cited

U.S. PATENT DOCUMENTS

| | | | |
|---|---|---|---|
| 9,173,312 B1* | 10/2015 | Jau .................. | G11B 33/126 |
| 9,781,859 B1* | 10/2017 | Wishman ............ | H05K 7/1491 |
| 9,936,601 B2* | 4/2018 | Amdahl .............. | H05K 7/1491 |
| 2008/0135714 A1* | 6/2008 | Huang ................ | A47B 88/493 |
| | | | 248/429 |
| 2010/0172083 A1* | 7/2010 | Randall .............. | G11B 33/126 |
| | | | 361/679.31 |
| 2012/0241187 A1* | 9/2012 | Gong .................. | H05K 7/1491 |
| | | | 174/68.3 |
| 2013/0003317 A1* | 1/2013 | Gong .................. | H01R 13/72 |
| | | | 361/726 |
| 2013/0077219 A1* | 3/2013 | Fu ...................... | H02G 11/006 |
| | | | 361/679.02 |

* cited by examiner

*Primary Examiner* — Nidhi Thaker
(74) *Attorney, Agent, or Firm* — ScienBiziP, P.C.

(57) ABSTRACT

A server rack able to maintain electrical connections to its components during replacements includes a shell and brackets for data storage devices. The data storage devices are electrically connected to the bracket. The shell includes a power supply module and a connecting device electrically connected to the power supply module. The connecting device includes a resilient ring and a cable, one end of the cable is secured on the resilient ring, and the other end of the cable is electrically connected to the bracket. When the bracket is slid in the shell, the resilient ring elastically deforms to release cable or take back the slack cable, to maintain the electrical connections at all times.

14 Claims, 7 Drawing Sheets

SERVER RACK

CROSS-REFERENCE TO RELATED APPLICATIONS

This application claims priority to Chinese Patent Application No. 201611208195.4 filed on Dec. 23, 2016 the contents of which are incorporated by reference herein.

FIELD

The subject matter herein generally relates to a server rack.

BACKGROUND

The server generally needs hot-swappable hard drive. Therefore, a server rack must receive the hard disk, and the server rack is equipped with slide rails to conveniently slide the hard drive into the rack.

BRIEF DESCRIPTION OF THE DRAWINGS

Implementations of the present technology will now be described, by way of example only, with reference to the attached figures.

DETAILED DESCRIPTION

Figure 1:
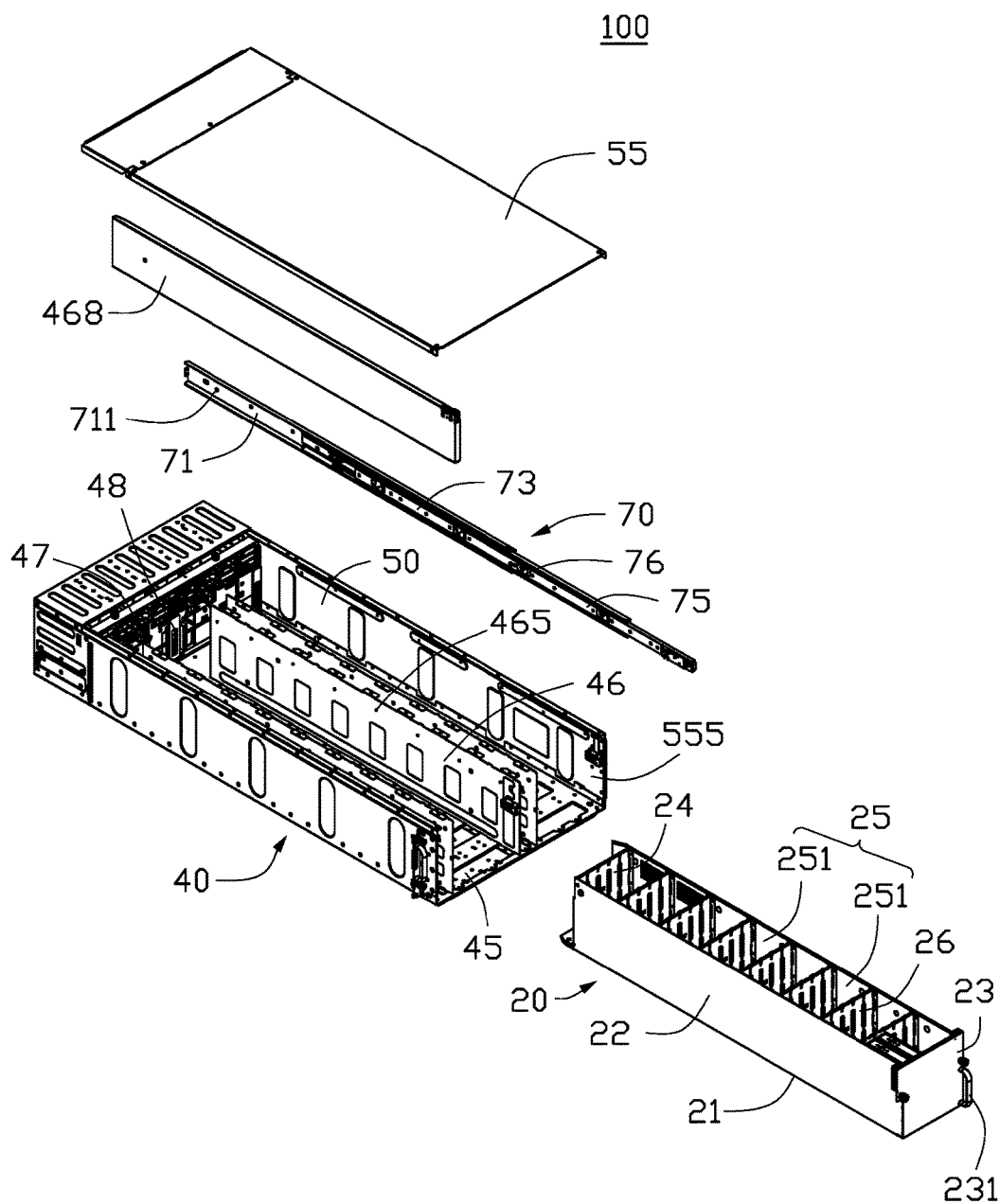
FIG. 1 is an exploded view of an exemplary embodiment of a server rack and a plurality of data storages.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "outside" refers to a region that is beyond the outermost confines of a physical object. The term "inside" indicates that at least a portion of an object is contained within a boundary formed by another object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 illustrates one exemplary embodiment of a server rack 100 for receiving a plurality of data storages 10. The server rack 100 includes a plurality of brackets 20 configured to receive the data storages 10, and a shell 40 configured to receive the brackets 20. The data storages 10 are received in the brackets 20 and electrically connected with the brackets 20.

Figure 2:
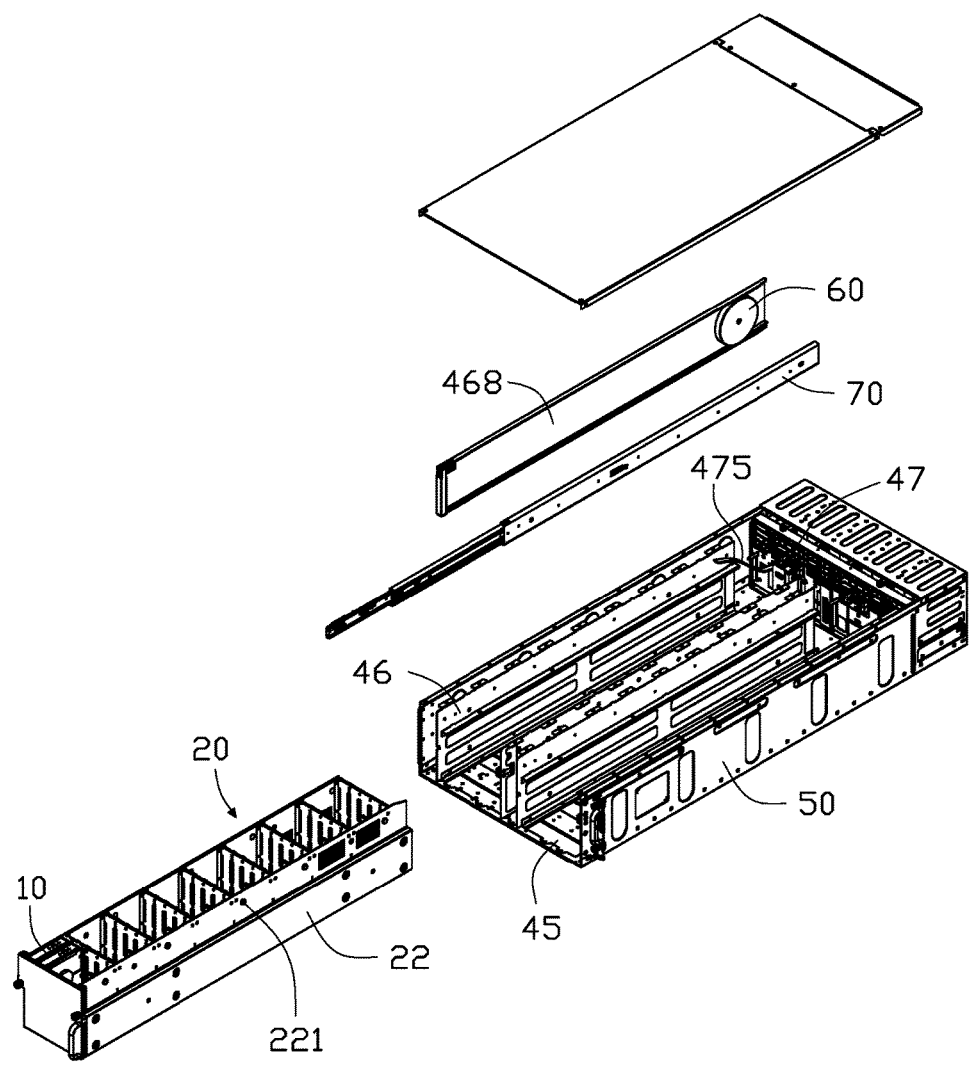
FIG. 2 is similar to FIG. 1, but viewed from another angle.

FIG. 1 and FIG. 2 illustrate that the bracket 20 includes a bottom wall 21, the sidewalls 22 connect with the sides of the bottom wall 21, a front wall 23 is connected with the front end of the bottom wall 21, and a rear wall 24 is connected with the rear end of the bottom wall 21. The bottom wall 21, the two sidewalls 22, the front wall 23, and the rear wall 24 together define a receiving space 25 to receive the data storages 10.

The bracket 20 includes a plurality of baffles 26, and the baffles 26 are parallel to each other. Each end of each baffle 26 is perpendicular to the sidewall 22. The baffles 26 divide the receiving space 25 into a plurality of receiving portions 251, and each receiving portion 251 is configured to receive a plurality of data storages 10.

One of the sidewall 22 includes a plurality of fasteners 221 secured on the server rack 100 to secure the bracket 20 on the server rack 100. One side of the front wall 23 includes a handle 231, and the handle 21 is configured to pull or push the bracket 20. The rear wall 24 includes a plurality of electrical connectors (not shown). The electrical connectors are configured to transmit data and power.

Figure 3:
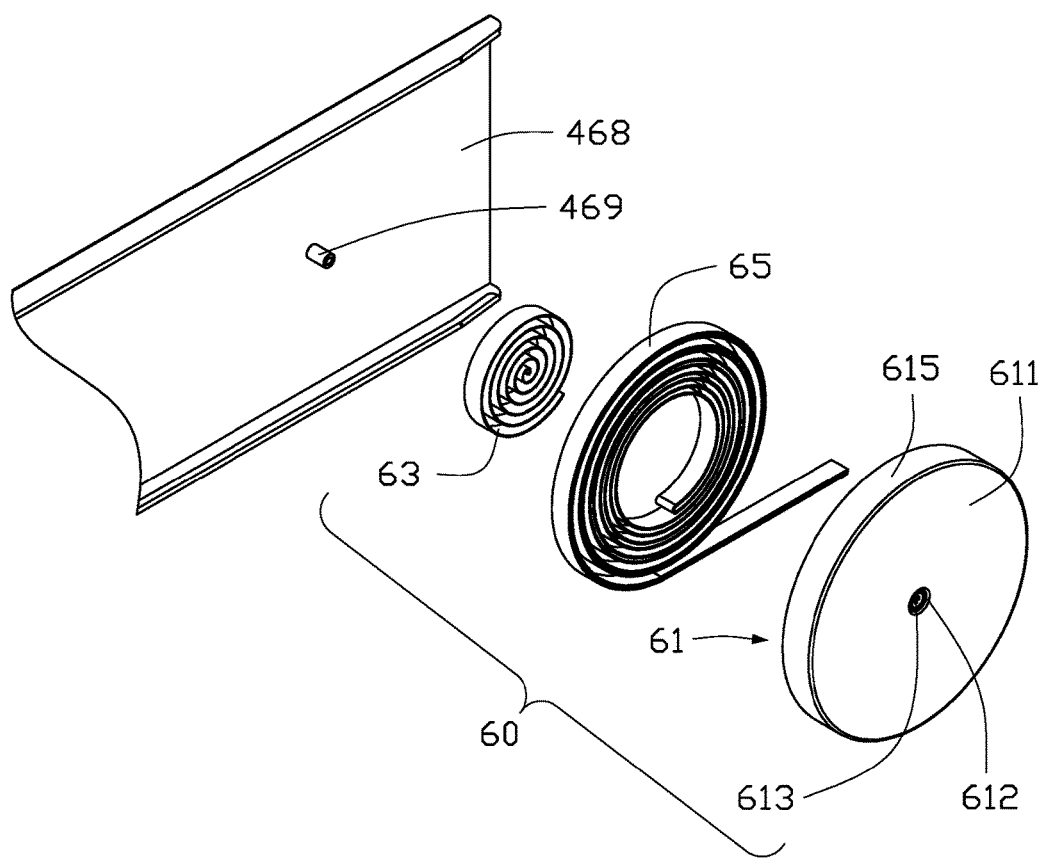
FIG. 3 is an exploded view of an adapter plate and a connecting device of the server rack of FIG. 1.

FIG. 1 to FIG. 3 illustrate that the shell 40 includes a bottom plate 45, side plates 50 connected with the sides of the bottom plate 45, and a top plate 55 connected with two side plates 50. The bottom plate 45, the front end of the side plate 50, and a top plate 60 together define an opening 555. The bracket 20 can be inserted into the opening 555.

The bottom plate 45 includes a plurality of mounting plates 46, and the mounting plates 46 are perpendicularly connected with the bottom plate 45 and parallel to the side plate 50. The top end of one of the mounting plate 46 defines a plurality of mounting holes 465. A plurality of fixing members (not shown) can be inserted into the mounting holes 465 to secure a slide rail module 70 on the mounting plate 46. The other mounting plate 46 includes an adapter plate 468, and the extension of the adapter plate 468 is parallel to the bottom plate 45.

The shell includes a power supply module 47 at the rear end of the rear plate 45. The power supply module 47 is configured to provide power to the data storages. The adapter plate 468 is equipped with a hollow positioning column 469 close to the power supply module 47. The positioning column 469 defines a plurality of internal threads, and a connecting device 60 is configured to be inserted into the positioning column 469 to be secured on the adapter plate 468. The power supply module 47 is connected with the connecting device 60 through a cable 475. The shell 40 includes a plurality of interfaces 48 at the rear end of the rear plate 45. The electrical connector of the bracket 20 is inserted into the interface 48 to connect the data storage 10 with a server.

Figure 4:
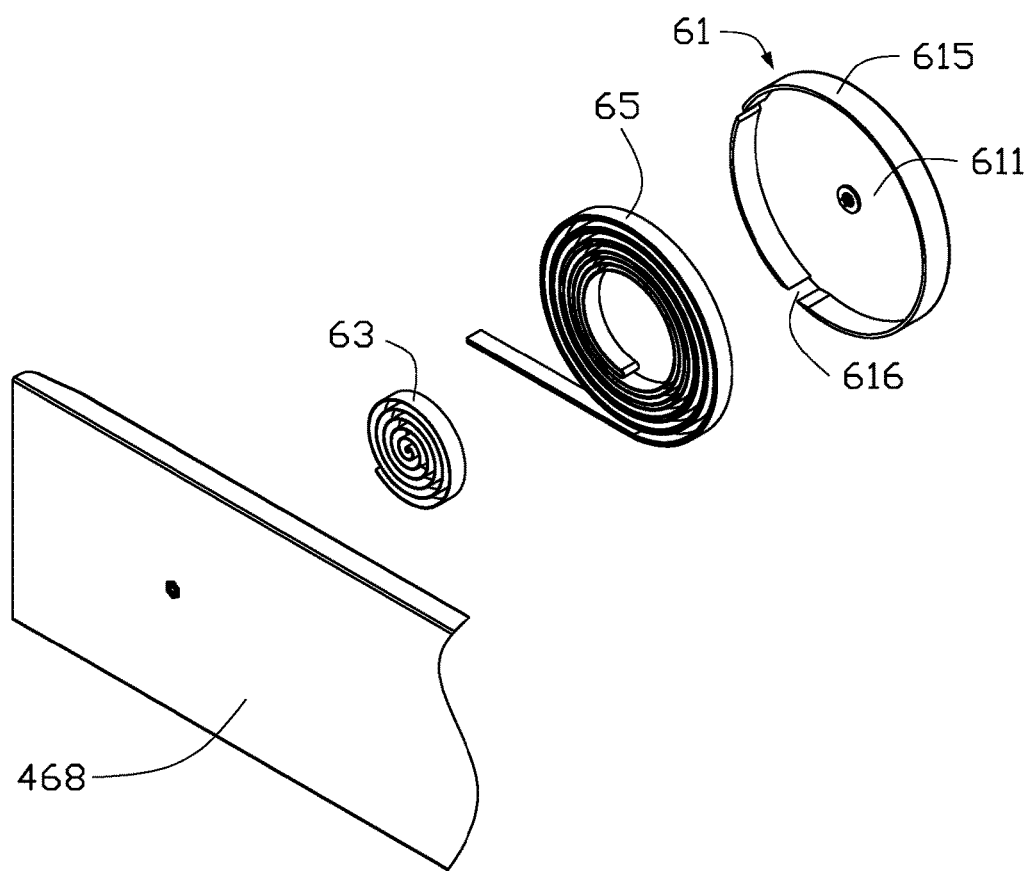
FIG. 4 is similar to FIG. 3, but viewed from another angle.

FIG. 3 and FIG. 4 illustrate that the connecting device 60 includes a protective member 61, a resiliently wound resilient ring 63, and a cable 65 encircling the outer side surface of the resilient ring 63.

The protective member 61 includes a cover 611 and fixing ring 615 surrounding the cover 611. The middle portion of the cover 611 defines a through hole 612. A securing member 613 can pass through the through hole 612 and be inserted into the positioning column 469 to secure the protective member 61 on the adapter plate 468. The fixing ring 615 defines two gaps 616 for allowing the cable 475, 65 to pass through.

The resilient ring 63 is bent in a spiral shape. The resilient ring 63 includes a first end and a second end opposite to the first end. The first end is secured on the positioning column 469 and the second end is connected with the cable 475, 65. The cables 475, 65 are substantially flat, and the cable 65 is surrounding the outside of the resilient ring 63. The cable 65 and the resilient ring 63 are received in the protective member 61. One end of the cable 65 is electrically connected to one end of the cable 475, and cables 65 and 475 are together secured on the first end of the resilient ring 63. The other end of the cable 65 is electrically connected to the bracket 20.

FIG. 1 illustrates that the slide rail module 70 includes an outer rail 71, a middle rail 73 slidably installed on the outer rail 71, and an inner rail 75 slidably installed on the middle rail 73. The outer rail 71 defines a plurality of through holes 711. The fixing member can pass through the through hole 711 and be inserted into the mounting hole 465 to secure the outer rail 71 on the mounting plate 46. The inner rail 75 is equipped with a plurality of latch members 76. The fastener 221 can be fixed in the latch member 76 to secure the bracket 20 on the inner rail 75.

Figure 5:
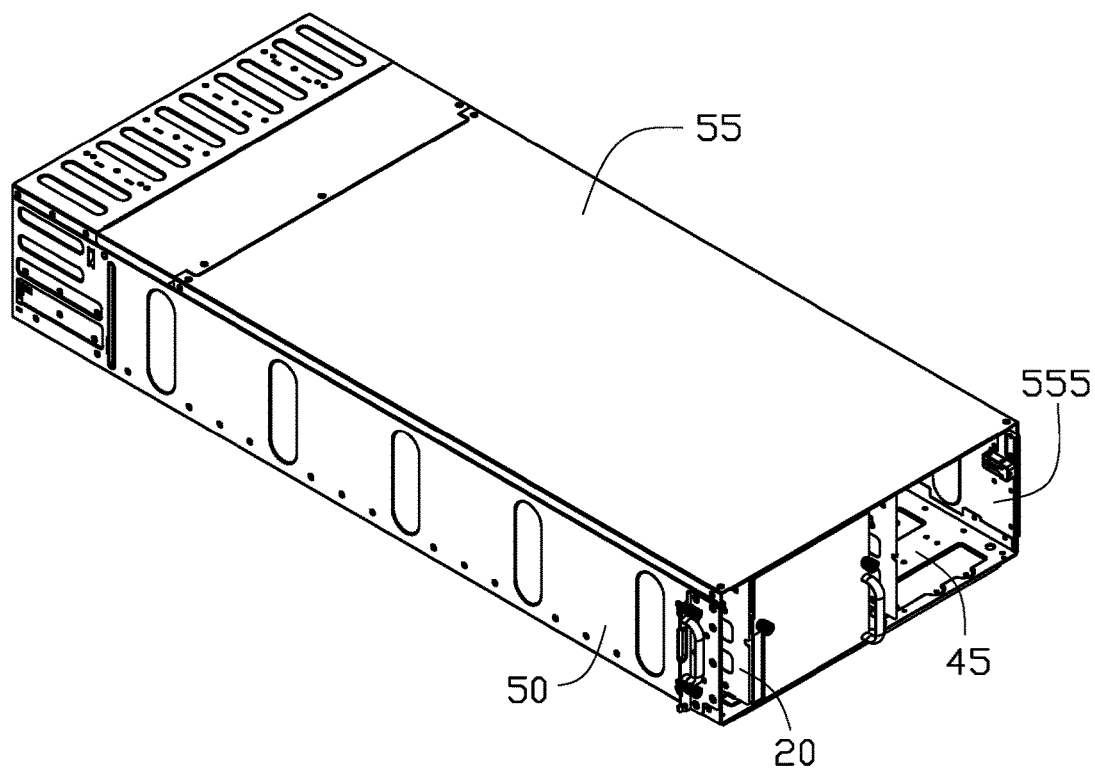
FIG. 5 is an assembled view of the server rack and the plurality of data storages of FIG. 1.
Figure 6:
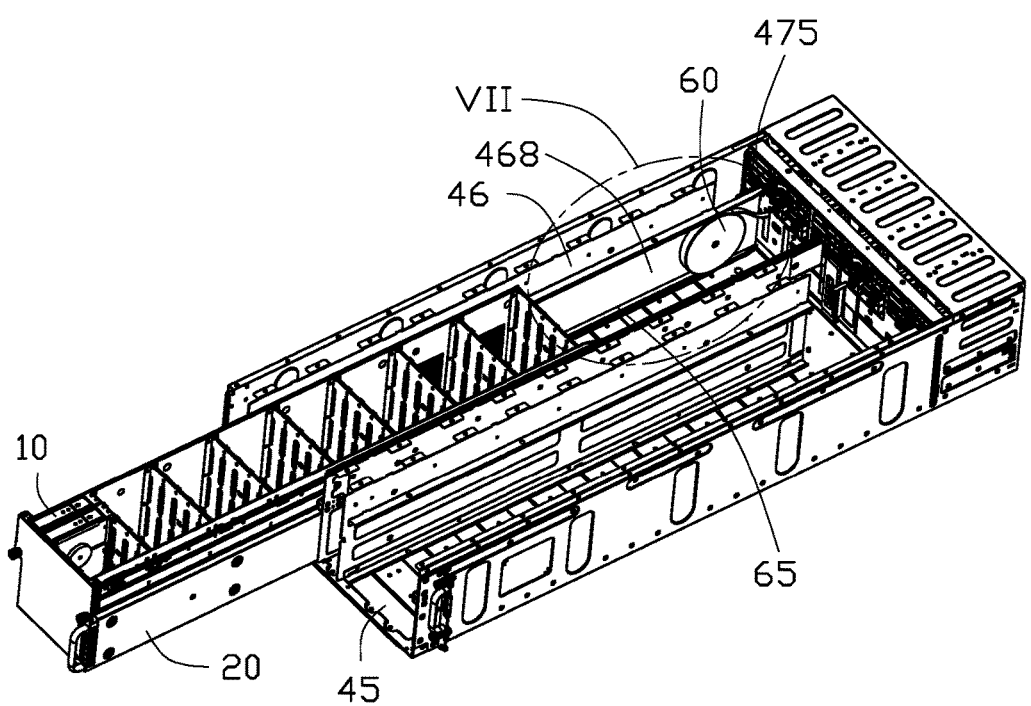
FIG. 6 is another assembled view of the server rack and the plurality of data storages of FIG. 1, but a top plate is not shown.
Figure 7:
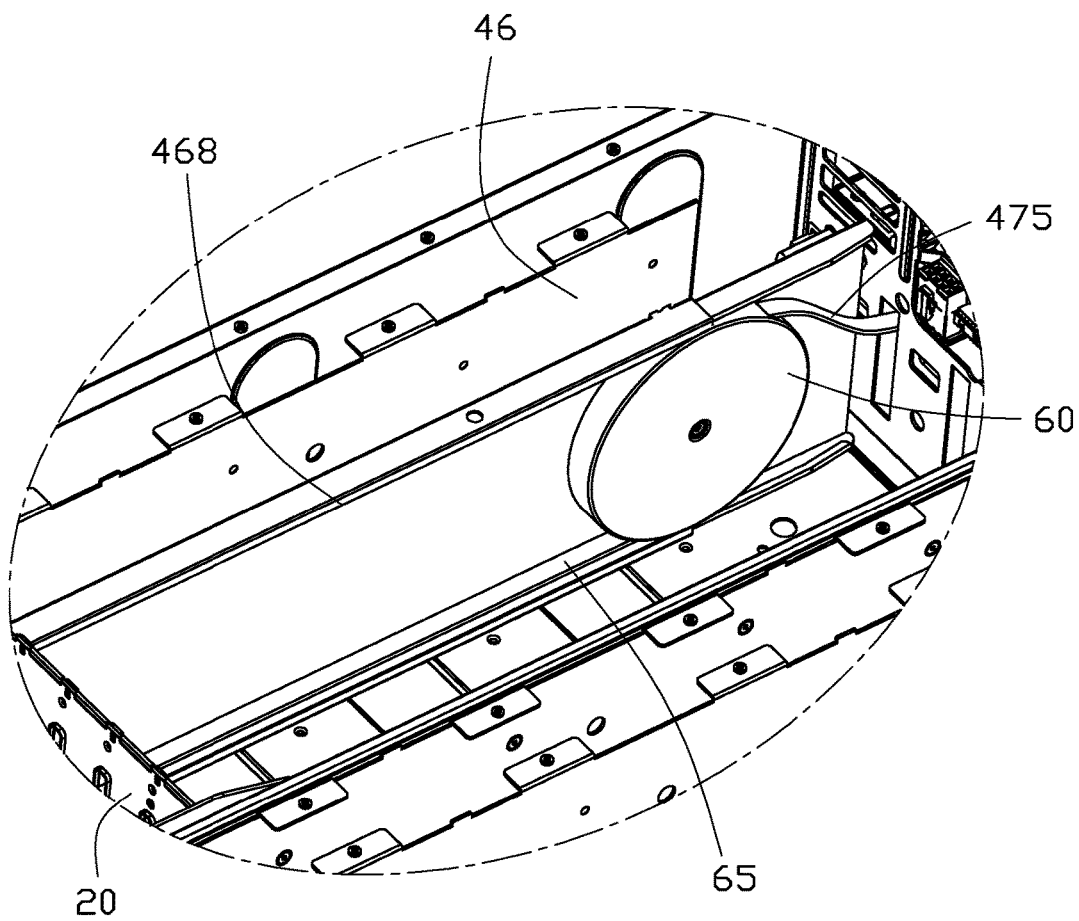
FIG. 7 is an enlarged view of circled area VII in FIG. 6.

FIGS. 5 to 7 illustrate assembly of the server rack 100. The mounting plate 46 is secured on the bottom plate 45, and the securing member passes through the through hole 711 of the outer rail 71 and is inserted into the mounting hole 465 to secure the slide rail module 70 on the mounting plate 46. The adapter plate 468 is secured on the other mounting plate 46 and the extension of the adapter plate 468 is parallel to the bottom plate 45. The power supply module 47 is secured on the rear end of the bottom plate 45. The cover 55 is secured on the top end of the side plates 50.

The first end of the resilient ring 63 is secured on the positioning column 469 of the adapter plate 468. Both sides of the cable 475 are secured on the second end of the resilient ring 63 and the power supply module 47. The cable 65 surrounds the resilient ring 63, and one end of the cable 65 is secured on the second end of the resilient ring 63, to be electrically connected to the cable 475.

The protective member 61 is located on the adapter plate 468, the resilient ring 63 and the cable 65 are received in the protective member 61. The other end of the cable 65 can pass through one of the gaps 616 of the protective member 61, and the cable 475 can pass through the other gap 616 of the protective member 61. The through hole 612 of the protective member 61 is aligned with the positioning column 469, and the securing member 613 passes through the through hole 612 and screw into the positioning column 469. The connecting device 60 is thereby secured on the adapter plate 468. Thus the shell 40 is assembled completely.

Referring to FIG. 1, the data storages 10 are placed in the receiving portion 251 of the bracket 20 and electrically connected to the bracket 20. The inner rail 75 and the middle rail 73 are slid out of the opening 555, and the fastener 221 of the sidewall 22 is latched on the latch member 76 of the inner rail 75 to secure the bracket 20 on the slide rail module 70. One end of the cable 65 is electrically connected to the rear end of the bracket 20. The bracket 20 is pushed to slide the inner rail 75 into the middle rail 73, and the middle rail 75 is slid into the outer rail 75. When the bracket 20 passes through the opening 555 and is received in the server rack 100, the electrical connector of the rear wall 24 is connected with the interface 48. Then, the data storage 10 and the bracket 20 are slidably installed on the server rack 100.

Referring to FIGS. 1, 6, and 7 illustrate removal of the bracket 20. The handle 231 of the bracket 20 is pulled out and the bracket 20 is slid out of the opening 555. During the sliding process, the bracket 20 pulls on the cable 65. The resilient ring 63 is accordingly and elastically deformed and the cable 65 is pulled out of the gap of the protective member 61. The cable 65 remains electrically connected to the bracket 20. The data storages in the bracket 20 retain an electrical connection to the power supply module 47 through the cable 475, 65 at all times, thus preventing the data storages 10 from losing data due to power failure.

When the bracket 20 is received in the shell 40, the resilient ring 63 elastically rewound to pull on the cable 65, and the cable 65 is retracted into the protective member 65, to prevent the cable 65 from heaping or lying loose in the shell 40.

The exemplary embodiments shown and described above are only examples. Many details are often found in the art such as the other features of a server rack. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A server rack, comprising: a shell comprising a connecting device and a power supply module configured to provide power to a plurality of data storages; and a plurality of brackets configured to receive the plurality of data storages, the data storages electrically connected to the bracket; wherein the connecting device comprises a resilient ring and a cable, one end of the cable is secured on the resilient ring, the other end of the cable is electrically connected to the bracket, when the bracket is slid in the shell, the resilient ring can elastically deformed to release or retract the cable to maintain constant electrical connection between the data storages and the power supply module, wherein the shell comprises a bottom plate and a plurality of mounting plates connected with the bottom plate, one of the mounting plates is equipped with an adapter plate, and the connecting device is mounted on the adapter plate, where the connecting device further comprises a protective member secured or the adapter plate, the resilient ring and the cable are received in the protective member, and wherein one end of the adapter plate close to the power supply module comprises a positioning column, the protective member comprises a cover, the cover defines a through hole, and a securing member can pass through the through hole to be inserted into the positioning column to secure the protective member on the adapter plate.

2. The server rack of claim 1, wherein the resilient ring comprises a first end and a second end opposite to the first end, the first end is secured on the positioning column, and the second end is connected with the cable.

3. The server rack of claim 1, wherein protective member comprise a securing ring, the securing ring defines a gap, and the cable can pass through the gap to be electrically connected to the bracket.

4. The server rack of claim 1, wherein the mounting plate comprises a slide rail module, the bracket is secured on the slide rail module to be slidably installed on the shell.

5. The server rack of claim 4, wherein the slide rail module comprises a outer rail, the outer rail defines a plurality of through holes, the mounting plate defines a plurality of mounting holes, and a plurality of fixing members passes through the through hole to be inserted into the mounting hole to secure the outer rail on the mounting plate.

6. The server rack of claim 5, wherein the slide rail module further comprise a middle rail slidably installed on the outer rail and an inner rail slidably installed on the middle rail, the bracket is secured on the inner rail.

7. The server rack of claim 6, wherein the inner rail comprises a plurality of latch members, one sidewall of the bracket defines a plurality of fasteners, and the fasteners are secured on the latch members to secure the bracket on the inner rail.

8. An electronic device, comprising: a plurality of data storages; and a server rack, comprising: a shell, comprising a connecting device and a power supply module configured to provide power to the data storages; and a plurality of brackets configured to receive the data storages, the data storages electrically connected to the bracket; wherein the connecting device comprises a resilient ring and a cable, one end of the cable is secured on the resilient ring, the other end of the cable is electrically connected to the bracket, when the bracket is slid in the shell, the resilient ring can elastically deformed to release or retract the cable to maintain constant electrical connection between the data storages and the power supply module, wherein the shell comprises a bottom plate and a plurality of mounting plates connected with the bottom plate, one of the mounting plates is equipped with an adapter plate, and the connecting device is mounted on the adapter plate, wherein the connecting device further comprises a protective member secured on the adapter plate, the resilient ring and the cable are received in the protective member, and wherein one end of the adapter plate close to the power supply module comprises a positioning column, the protective member comprises a cover, the cover defines a through hole, and a securing member can pass through the through hole to be inserted into the positioning column to secure the protective member on the adapter plate.

9. The electronic device of claim 8, wherein the resilient ring comprises a first end and a second end opposite to the first end, the first end is secured on the positioning column, and the second end is connected with the cable.

10. The electronic device of claim 8, wherein protective member comprise a securing ring, the securing ring defines a gap, and the cable can pass through the gap to be electrically connected to the bracket.

11. The electronic device of claim 8, wherein the mounting plate comprises a slide rail module, the bracket is secured on the slide rail module to be slidably installed on the shell.

12. The electronic device of claim 11, wherein the slide rail module comprises a outer rail, the outer rail defines a plurality of through holes, the mounting plate defines a plurality of mounting holes, and a plurality of fixing members passes through the through hole to be inserted into the mounting hole to secure the outer rail on the mounting plate.

13. The electronic device of claim 12, wherein the slide rail module further comprise a middle rail slidably installed on the outer rail and an inner rail slidably installed on the middle rail, the bracket is secured on the inner rail.

14. The electronic, device of claim 13, wherein the inner rail comprises a plurality of latches, one side ail of the bracket defines a plurality of fasteners, and the fasteners are secured on the latches to secure the bracket on the inner rail.

* * * * *